(12) United States Patent
Klass

(10) Patent No.: US 11,500,019 B2
(45) Date of Patent: Nov. 15, 2022

(54) AREA-AWARE TEST PATTERN COVERAGE OPTIMIZATION

(71) Applicant: Apple Inc., Cupertino, CA (US)

(72) Inventor: Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 202 days.

(21) Appl. No.: 16/874,075

(22) Filed: May 14, 2020

(65) Prior Publication Data

US 2021/0356523 A1 Nov. 18, 2021

(51) Int. Cl.
*G01R 31/3183* (2006.01)
*G06F 30/367* (2020.01)
*G01R 31/28* (2006.01)

(52) U.S. Cl.
CPC ... *G01R 31/31835* (2013.01); *G01R 31/2889* (2013.01); *G06F 30/367* (2020.01)

(58) Field of Classification Search
None
See application file for complete search history.

(56) References Cited

U.S. PATENT DOCUMENTS

| | | | |
|---|---|---|---|
| 8,203,356 B2 | 6/2012 | Gummer | |
| 8,762,095 B2 | 6/2014 | Van Wagenen et al. | |
| 9,117,052 B1 | 8/2015 | Salowe et al. | |
| 9,694,034 B2 | 6/2017 | Eng et al. | |
| 2009/0082979 A1* | 3/2009 | Sato | G01R 31/2831 702/59 |
| 2009/0132976 A1* | 5/2009 | Desineni | G01R 31/318342 716/106 |
| 2014/0289579 A1* | 9/2014 | Podder | G01R 31/318547 714/738 |

* cited by examiner

*Primary Examiner* — Jermele M Hollington
*Assistant Examiner* — Suresh K Rajaputra
(74) *Attorney, Agent, or Firm* — Kowert, Hood, Munyon, Rankin & Goetzel, P.C.; Lawrence J. Merkel

(57) ABSTRACT

In some embodiments, a method may include an area-aware optimization for the test patterns. The method may include dividing the chip area into a grid. The grid may be based on the smallest particle size. The method may include preparing test patterns and identifying a subset of test patterns that touch all of the grid locations. The subset may include a minimum number of test patterns from the prepared test patterns which when implemented exercise the all of the grid locations. The method allows to more quickly determine chips that fail due to extrinsic defects. Once a test fails during the testing process for a chip, testing on the chip is stopped and testing begins on the next chip. Rapidly identifying chips that fail due to extrinsic failures can decrease the overall test time and identify those that will fail quickly as the chip process matures and is dominated by extrinsic failures.

16 Claims, 5 Drawing Sheets

AREA-AWARE TEST PATTERN COVERAGE OPTIMIZATION

BACKGROUND

Technical Field

Embodiments described herein relate to semiconductor devices and methods for testing semiconductor devices. More particularly, some embodiments disclosed herein include methods for increasing the production efficiency of semiconductor devices by decreasing the time required to test the semiconductor device.

Description of the Related Art

As the push for smaller and smaller packages increases, more and more transistors are being packed into the same footprint of silicon area. For example, FIG. 1 is a block diagram illustrating an embodiment of an integrated circuit 100 on a semiconductor substrate 110 depicting various circuit paths 120 with density n while FIG. 2 illustrates an integrated circuit 200 on a semiconductor substrate 210 depicting various circuit paths 220 at a greater density (e.g., designated n+1) than for example the integrated circuit depicted in FIG. 1. Increases in density are generally made possible via improvements in the semiconductor fabrication process technology over time. The density possible at a given version of the process technology is typically expressed via the minimum feature size that can be achieved in that process technology (e.g. 10 nanometer (nm), 7 nm, 5 nm, etc.). The version of the process technology is referred to as a process node (e.g. 10 nm node, 7 nm node, 5 nm node, etc.).

The time required to test the integrated circuit (IC) increases with the number of transistors. The increasing test time is due to the fact that test patterns are generated until coverage of the transistors reaches a required threshold (e.g., 95%, 99%, etc.). In other words, patterns are continually generated and patterns are saved that test untested transistors until there exists a pattern set that exercises the required percentage of transistors. The test pattern generation tools today do not have any concept of area or location of transistors and paths between them. The test pattern generation tools merely generate patterns until all the transistors have been exercised (or some very high percentage to meet the test coverage requirements). Generally, a test pattern comprises a set of initial state for storage devices in the integrated circuit (e.g. latches, registers, flip flops, and any other clocked storage devices) and a set of expected outputs that should be generated and captured by clocked storage devices in the integrated circuit in response to the initial state. A testing device coupled to the integrated circuit at various points during manufacture may load the initial state (e.g. using a test interface to the integrated circuit such as a scan interface, joint test access group (JTAG) interface, etc.), clock the integrated circuit to capture the result, and retrieve the result to compare to the expected outputs. If there are not defects in the integrated circuit, the test passes. If there are defects that affect the result, the test fails and the integrated circuit is discard.

As process nodes mature, the rate of actual defects decreases until it is dominated by extrinsic defects. Extrinsic defects occur due to particle contamination during the process, rather than intrinsic defects which occur due to process variations. Particles are not shrinking in size, however. A given particle contaminant will simply affect more paths as transistors continue to shrink.

SUMMARY OF EMBODIMENTS

In some embodiments, a method may include an area-aware optimization for the test patterns. The method may include dividing the chip area into a grid. The grid may be based on the smallest particle size. The method may include preparing test patterns and identifying a subset of test patterns that touch all of the grid locations. The subset may include a minimum number of test patterns from the prepared test patterns which, when implemented, exercise all of the grid locations (or a predetermined percentage of the grid locations). The method allows more rapid determination of chips that fail due to extrinsic defects. Once a test fails during the testing process for a chip, testing on the chip is stopped and testing begins on the next chip. Rapidly identifying chips that fail due to extrinsic failures can decrease the overall test time and identify those that will fail quickly as the chip process matures and is dominated by extrinsic failures.

In some embodiments, the net list or other chip description files may be annotated with location information based on the identified grid. A given path can cover multiple grid locations. In some embodiments, the patterns are post processed and sorted based on area coverage and identify a small subset that hits all of, or the required percentage of, the grid locations.

In some embodiments, a coarse-grained grid is defined for which test patterns are determined as well as the corresponding subset used to remove faulty chips. A finer grained grid is then defined for which test patterns are determined as well as a second corresponding subset used to remove faulty chips. Finer grained grids may be defined and corresponding subsets of test patterns may be determined until a subset of test patterns is run at the finest-grain level. The remaining patterns after the finest-grain subset has passed can be run on the parts that have passed the area-based patterns, to ensure full coverage.

In some embodiments, a method may include identifying a first test pattern to test an integrated circuit. The integrated circuit has an area of semiconductor substrate on which it is to be fabricated. The area is conceptually divided into a grid of subareas. The first test pattern may exercise circuit paths within a first subset of the subareas. The method may include identifying a second test pattern that exercises circuit paths within a second subset of the subareas. The method may include determining that at least one of subareas in the second subset is excluded from the first subset. The method may include the second test pattern in a first group of tests to be applied to the integrated circuit prior to other test patterns responsive to determining that at least one of the subareas in the second subset is excluded from the first subset.

In some embodiments, the area is conceptually divided into the grid of subareas based on a minimum particle contaminant size. In some embodiments, the area is conceptually divided into a first grid of subareas based on a size greater than a minimum particle contaminant size and identifying a first group of tests; wherein the area is conceptually divided into a second grid of subareas smaller than the subareas of the first grid and identifying a second group of tests.

The method may further include identifying a third test pattern that exercises circuit paths within a third subset of the subareas and determining that at least one of subareas in the third subset is excluded from the first subset and the second subset. The method may further include the third test pattern in a first group of tests to be applied to the integrated circuit prior to other test patterns responsive to determining that at least one of the subareas in the third subset is excluded from the first subset and the second subset.

The method may further include generating test patterns that exercise at least a predetermined percentage of circuit paths in the integrated circuit.

In some embodiments, identifying the first test pattern to test the integrated circuit further includes identifying the first test pattern which exercises circuit paths through a greatest number of subareas relative to other test patterns. Identifying the second test pattern may further include identifying the second test pattern which exercises circuit paths through a greatest number of subareas excluded from the first test pattern.

In some embodiments, the method further includes applying the first group of tests to an integrated circuit to identify defects in the integrated circuit. Defects may include extrinsic defects caused by particle contaminants.

In some embodiments, the method further includes annotating an integrated circuit definition file with location data to identify which subareas a given circuit path passes through.

In some embodiments, the test patterns in the first group of tests contact all portions of the grid or at least a minimum threshold percentage of portions of the grid.

In some embodiments, a method may include identifying a first test pattern to test an integrated circuit, wherein the integrated circuit has an area of semiconductor substrate on which it is to be fabricated, wherein the area is conceptually divided into a grid of subareas based on a minimum particle contaminant size, and wherein the first test pattern exercises circuit paths within a first subset of the subareas.

In some embodiments, a method may include receiving a plurality of test patterns to be applied to an integrated circuit. The test patterns are arranged in a plurality of groups of test patterns to be applied to the integrated circuit in a specified order. The method may include applying the groups of test patterns in the specified order. The method may include detecting a failure during performance of the tests, stopping and indicating the integrated circuit is defective responsive to the failure. The failure may be the result of a defect. The defect may include extrinsic defects caused by particle contaminants.

BRIEF DESCRIPTION OF THE DRAWINGS

The following detailed description makes reference to the accompanying drawings, which are now briefly described.

Figure 1:
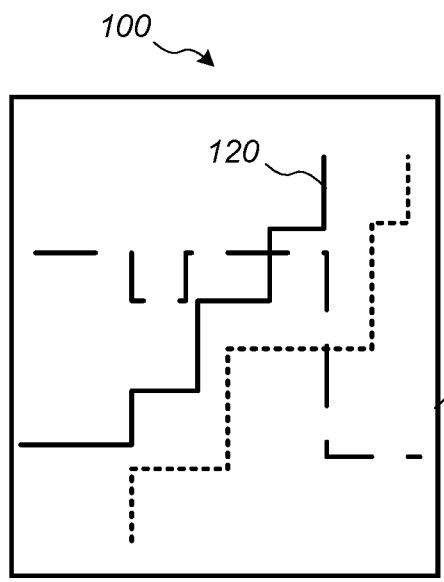
FIG. 1 is a block diagram illustrating an embodiment of an integrated circuit on a semiconductor substrate depicting various circuit paths with density n.
Figure 2:
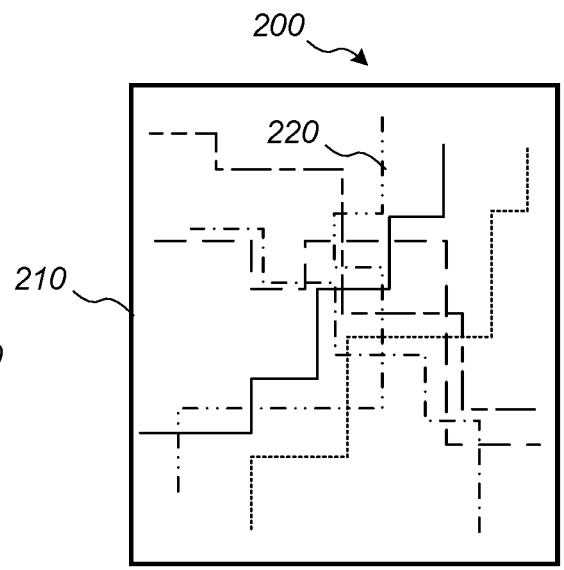
FIG. 2 is a block diagram illustrating an embodiment of an integrated circuit on a semiconductor substrate depicting various circuit paths at a greater density (i.e., designated n+1) than for example the integrated circuit depicted in FIG. 1.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

Definitions

Unless defined otherwise, all technical and scientific terms used herein have the same meaning as commonly understood by one of ordinary skill in the art.

The term "connected" as used herein generally refers to pieces which may be joined or linked together.

The term "coupled" as used herein generally refers to pieces which may be used operatively with each other, or joined or linked together, with or without one or more intervening members.

The term "directly" as used herein generally refers to one structure in physical contact with another structure, or, when used in reference to a procedure, means that one process effects another process or structure without the involvement of an intermediate step or component.

The term "extrinsic defects" as used herein generally refers to defects that occur due to particle contamination during the process, rather than intrinsic defects which occur due to process variations.

EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

For decades a race has been run to make integrated circuits not only more efficient but smaller. Integrated circuits have consistently migrated to smaller feature sizes over the years, allowing more circuitry to be packed on each chip. This increased capacity per unit area can be used to decrease cost and/or increase functionality. Typically, as the feature size shrinks the time, and consequently the cost, to test per unit area increases.

Figure 3:
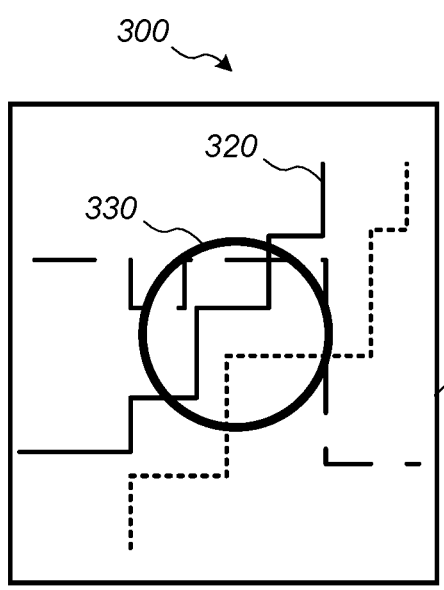
FIG. 3 is a block diagram illustrating an embodiment of an integrated circuit on a semiconductor substrate depicting various circuit paths with density n including a particle contaminant.
Figure 4:
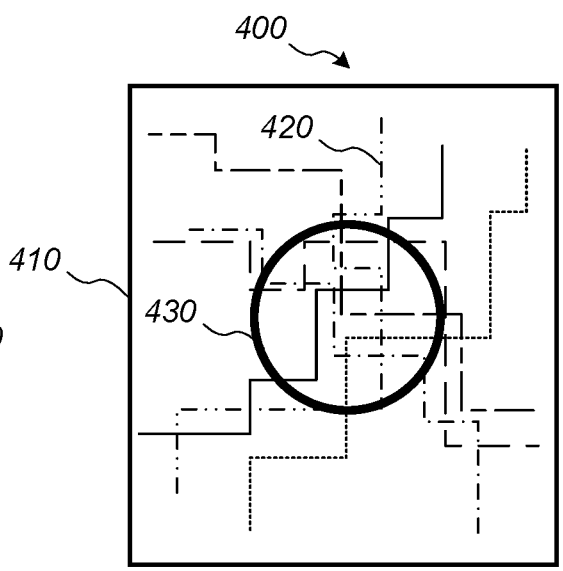
FIG. 4 is a block diagram illustrating an embodiment of an integrated circuit on a semiconductor substrate depicting various circuit paths at a particular density (i.e., designated n+1) including a particle contaminant.

As process nodes mature, the rate of actual defects decreases until it is dominated by extrinsic defects. Extrinsic defects occur due to particle contamination during the process, rather than intrinsic defects which occur due to process variations. Particles are not shrinking in size, however. A given particle contaminant will simply affect more paths as transistors continue to shrink. FIG. 3 is a block diagram illustrating an embodiment of an integrated circuit 300 on a semiconductor substrate 310 depicting various circuit paths 320 with density n including a particle contaminant 330. FIG. 4 is a block diagram illustrating an embodiment of an integrated circuit 400 on a semiconductor substrate 410 depicting various circuit paths 420 at a particular density (i.e., designated n+1) including a particle contaminant 430. As is depicted in FIGS. 3-4, a particle (circle) is shown in FIG. 3 for a less dense process and in FIG. 4 for a denser process. Any circuit path that passes through the area affected by the particle will detect the extrinsic failure caused by the particle. The particle contaminant will affect more paths in the denser integrated circuit depicted in FIG. 4 than the integrated circuit depicted in FIG. 3.

Particle contaminants 330 and 430 are representations of extrinsic defects.

Figure 5:
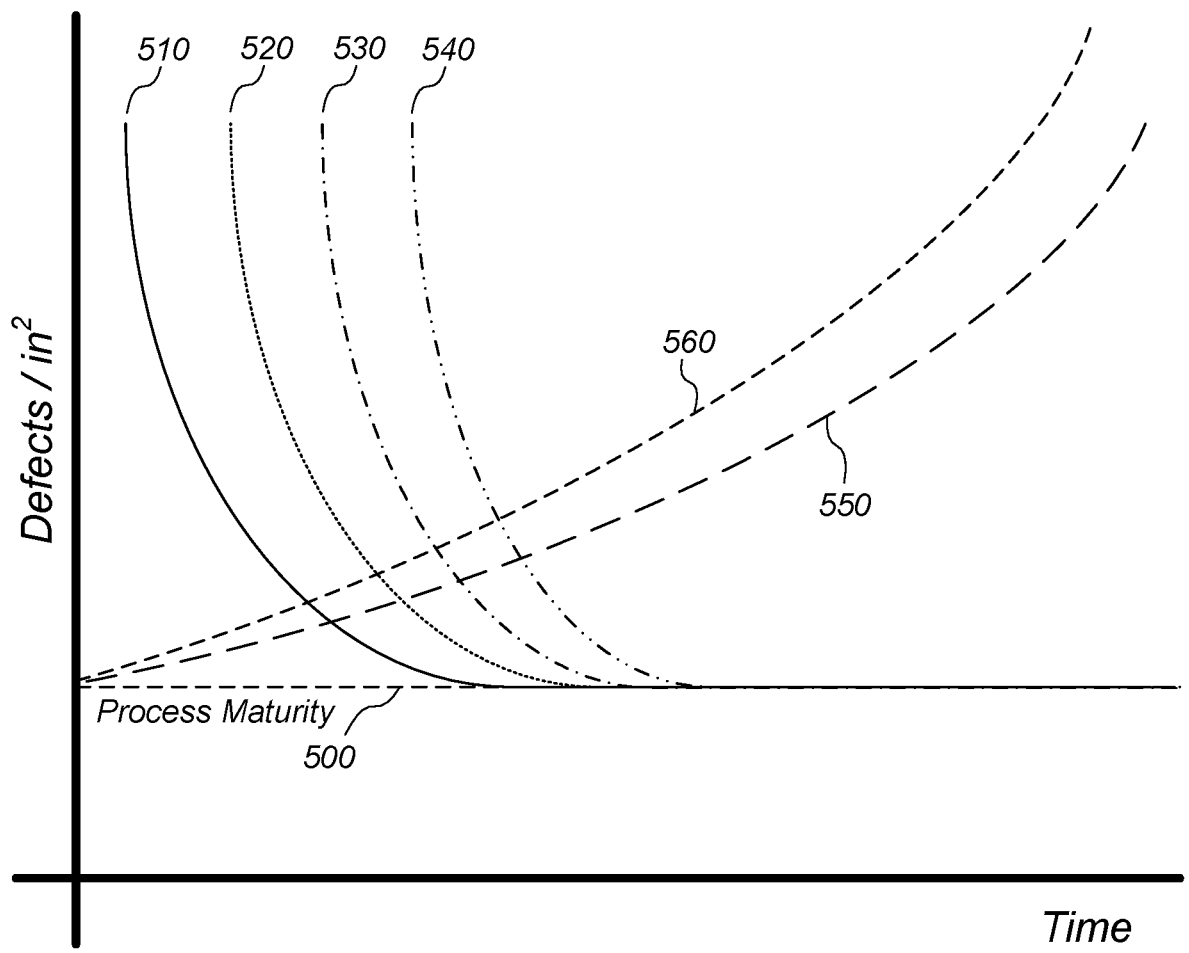
FIG. 5 is a graph depicting the relationship between the number of defects per square inch verses time. The graph also depicts the relationship between how the increasing number of transistors per square inch is directly related to an increasing amount of time needed to test an integrated circuit.

As the feature size shrinks the time, and consequently the cost, to test per unit area increases. FIG. 5 is a graph depicting the relationship between the number of defects per unit area verses time. As can be seen in the graph as a process node matures over time the number of defects per square inch decreases. Most of the defects eliminated over time are intrinsic defects. Process maturity is depicted by line 500. Line 510 represents a process node with density n, line 520 represents a process node with a greater density n+1, line 530 represents a process node with a greater density n+2, and line 540 represents a process node with the greatest density of n+3 for the nodes shown in FIG. 5. As is depicted, at a given point in time the older process nodes have fewer defects per square inch because the process is more mature than the newer process nodes. Most of the reduction in defects is due to the maturation of the production process and the reduction of the intrinsic defects to the point that eventually the vast majority of defects are extrinsic defects. The graph also depicts the relationship between how the increasing number of transistors per unit area (line 550) is directly related to an increasing amount of time needed to test an integrated circuit (line 560). As such anything that increases the speed at which integrated circuits can be tested for defects and fixed or discarded will increase the production of integrated circuits and reduce the cost.

Figure 6:
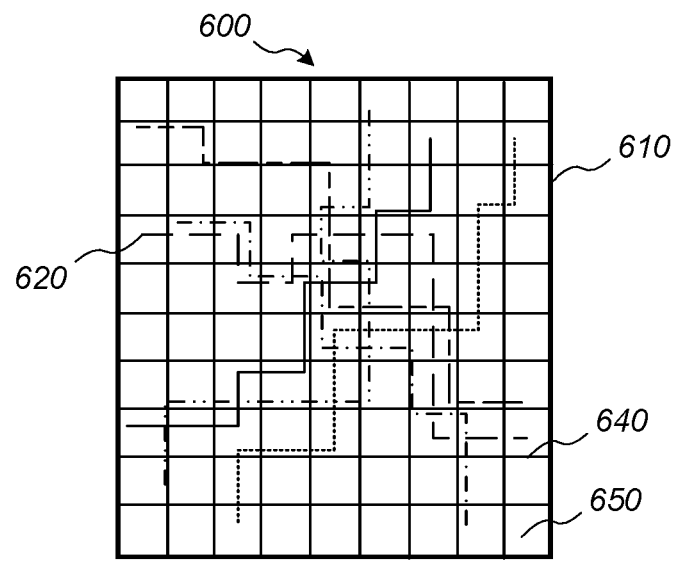
FIG. 6 is a block diagram illustrating an embodiment of an integrated circuit on a semiconductor substrate depicting various circuit paths at a density (i.e., designated n+1) including a particle contaminant depicting an area of the semiconductor substrate conceptually divided into a grid of subareas.
Figure 7:
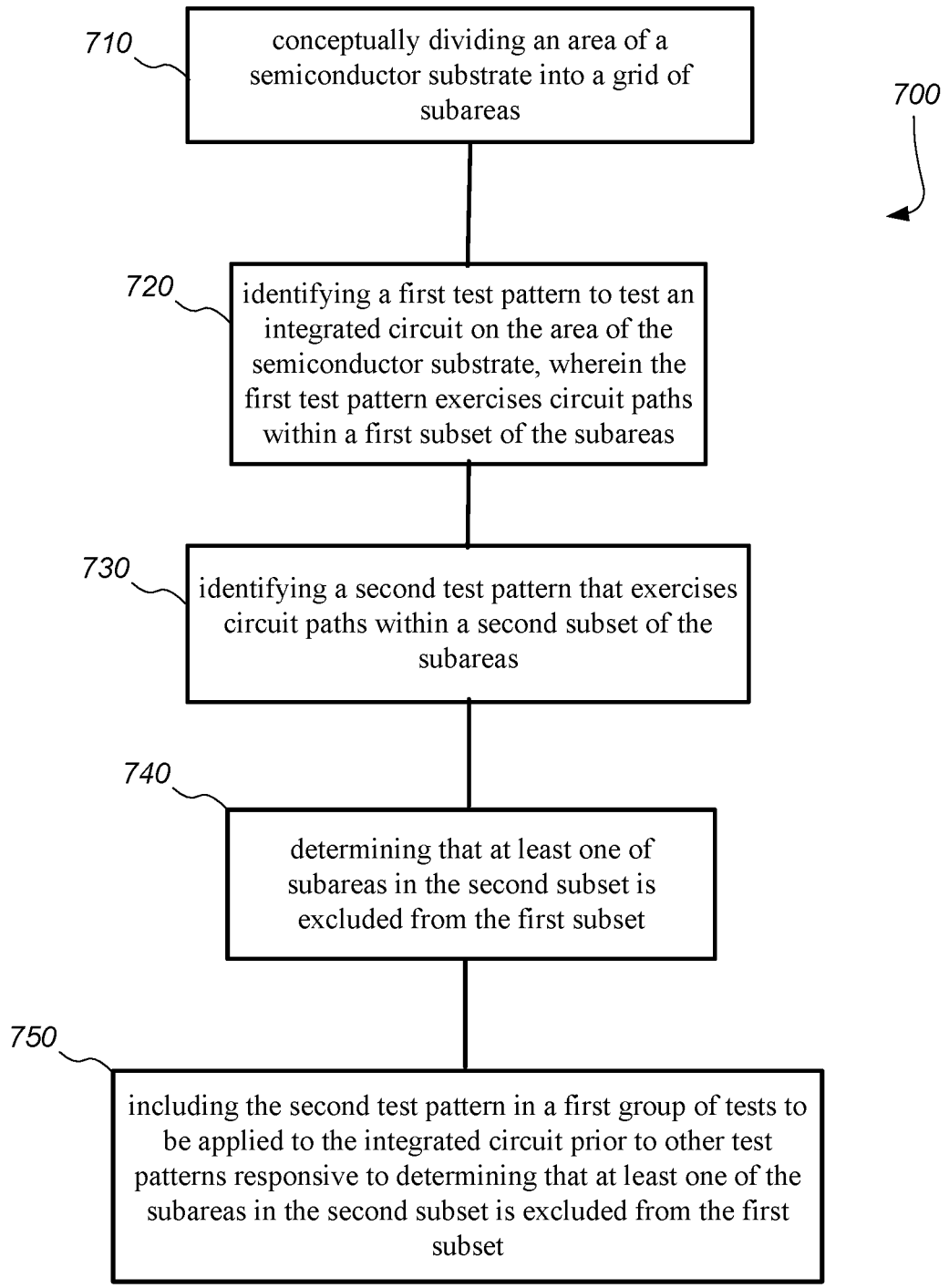
FIG. 7 is a flow chart depicting a method for increasing the production efficiency of semiconductor devices by decreasing the time required to test the semiconductor device.

In some embodiments, a method may include an area-aware optimization for the test patterns. FIG. 7 is a flow chart 700 depicting a method for increasing the production efficiency of semiconductor devices by decreasing the time required to test the semiconductor device. The method may include dividing ((710), e.g., conceptually) the chip area into a grid. The grid may be based on the smallest particle size. FIG. 6 is a block diagram illustrating an embodiment of an integrated circuit 600 on a semiconductor substrate 610 depicting various circuit paths 620 at a density (e.g., designated n+1). depicting an area of the semiconductor substrate conceptually divided into a grid 640 of subareas 650 (in this embodiment the grid and subareas are conceptual).

In some embodiments, the method may include preparing test patterns and identifying a subset of test patterns that touch all of the grid locations. The subset may include a minimum number of test patterns from the prepared test patterns which when implemented exercise all of the grid locations (or a predetermined percentage of the grid locations). The method allows to more quickly determine chips that fail due to extrinsic defects. Once a test fails during the testing process for a chip, testing on the chip is stopped and testing begins on the next chip. Rapidly identifying chips that fail due to extrinsic failures can decrease the overall test time and identify those that will fail quickly as the chip process matures and is dominated by extrinsic failures.

In some embodiments, the method may include identifying a first test pattern to test an integrated circuit (720). The integrated circuit has an area of semiconductor substrate on which it is to be fabricated. The area is conceptually divided into a grid of subareas. The first test pattern may exercise circuit paths within a first subset of the subareas. The subareas within which the first test pattern exercises circuit paths may be identified and noted.

The method may include identifying a second test pattern that exercises circuit paths within a second subset of the subareas (730). Once again, the subareas which the second test pattern exercises circuit paths within may be identified and noted. The method may include determining that at least one of subareas in the second subset is excluded from the first subset (740). For example, if a second test pattern only covers the same subareas (or only a portion thereof) of the first test pattern then the second test pattern may be discarded. If the second test pattern covers at least some subareas not covered by the first test pattern then the second test pattern may be retained. The method may include the second test pattern in a first group of tests to be applied to the integrated circuit prior to other test patterns responsive to determining that at least one of the subareas in the second subset is excluded from the first subset (750). In some embodiments, the test patterns in the first group of tests contact all portions of the grid or at least a minimum threshold percentage of portions of the grid.

In some embodiments, the method further includes applying the first group of tests to an integrated circuit to identify defects in the integrated circuit. Defects may include extrinsic defects caused by particle contaminants.

The method may further include identifying a third test pattern that exercises circuit paths within a third subset of the subareas and determining that at least one of subareas in the third subset is excluded from the first subset and the second subset. The subareas which the second test pattern exercises circuit paths within may be identified and noted such that different test patterns can be compared. The method may further include the third test pattern in a first group of tests to be applied to the integrated circuit prior to other test patterns responsive to determining that at least one of the subareas in the third subset is excluded from the first subset and the second subset. Any number of test patterns may be identified which, as a group, exercise the appropriate circuit paths which will test the appropriate subareas.

In some embodiments, the net list or other chip description files may be annotated with location information based on the identified grid. Annotation assists in identifying which subareas the circuit paths pass through, and thus which subareas are exercised using the test patterns such that test patterns can be compared. A given path can cover multiple grid locations, as depicted for example in FIG. 6.

In some embodiments, the patterns are generated based on coverage of transistors, and then the patterns are post processed and sorted based on area coverage to identify a small subset of test patterns that hits all of the grid locations. In an embodiment, at least some of the patterns may be sorted as the patterns are generated as is feasible. This sorting and/or processing may result in dramatically reducing the number of test patterns that are needed to test an integrated circuit for extrinsic defects as compared to current methods of testing integrated circuits therefore reducing costs. Processing may include determining the fewest number of test patterns which test all or a desired minimum percentage of the subareas.

In some embodiments, sorting or post processing includes identifying the first test pattern to test the integrated circuit. The first test pattern may exercise circuit paths through a greatest number of subareas relative to other test patterns. Identifying the second test pattern may further include identifying the second test pattern which exercises circuit paths through a greatest number of subareas excluded from the first test pattern, and so on until patterns are identified that test each subarea.

Figure 8:
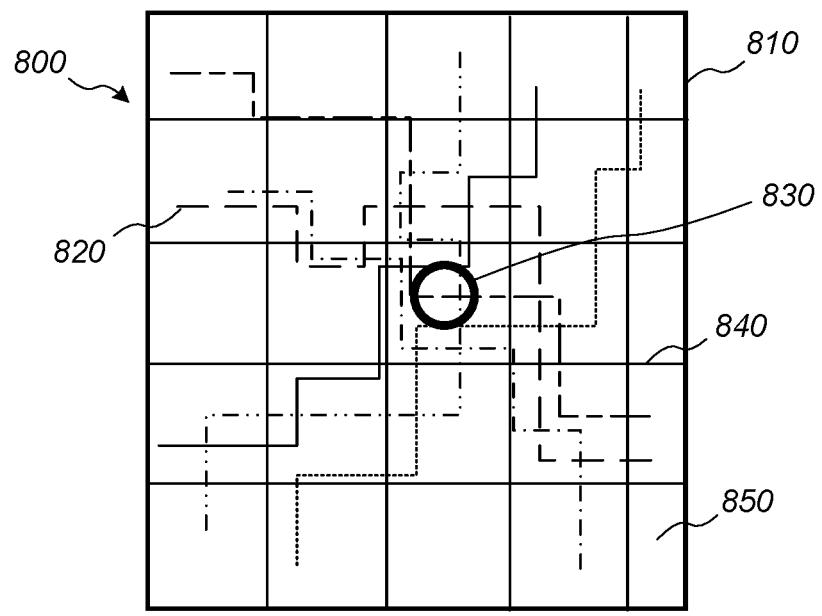
FIG. 8 is a block diagram illustrating an embodiment of an integrated circuit on a semiconductor substrate depicting various circuit paths at a density (i.e., designated n+1) including a particle contaminant depicting an area of the semiconductor substrate conceptually divided into a coarse grid of subareas.

In some embodiment, two or more conceptual grids may be applied to the chip area. The conceptual grids may include subareas of different sizes. In some embodiments, a coarse-grained grid 840 is defined for which test patterns are determined as well as the corresponding subset used to remove faulty chips 800 (on a semiconductor substrate 810 depicting various circuit paths 820) as depicted in FIG. 8. The coarse-grained grid 840 may include relatively larger subareas 850 relative to other grids and the typical smallest particle 830 (as depicted in FIG. 8). A coarse grid may be applied in some embodiments in order to determine defective chips, for example, large defects (e.g., due to large particles) which could not be fixed. Also, a large grid allows for fewer required tests in order to test all or a desired minimum percentage of the subareas leading to reduced costs.

Figure 9:
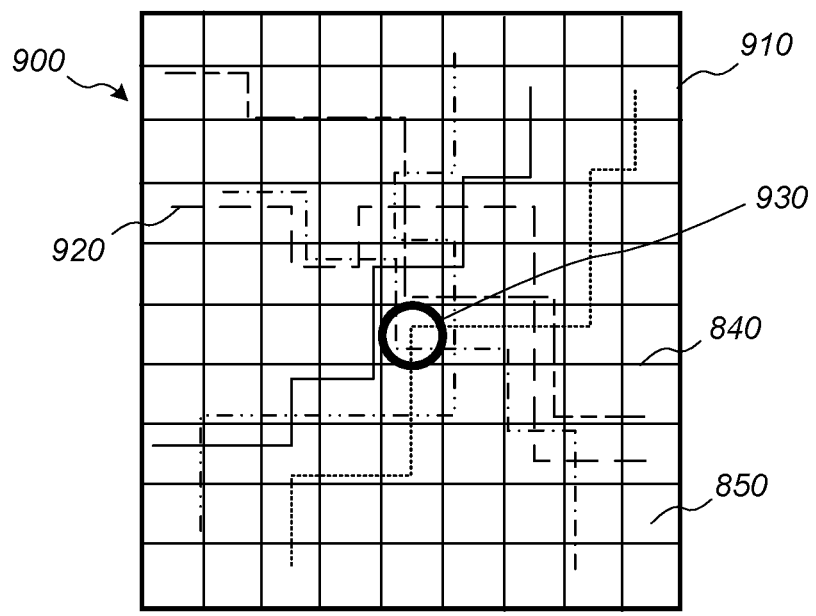
FIG. 9 is a block diagram illustrating an embodiment of an integrated circuit on a semiconductor substrate depicting various circuit paths at a density (i.e., designated n+1) including a particle contaminant depicting an area of the semiconductor substrate conceptually divided into a fine grid of subareas.

In some embodiments, a finer grained grid is then defined for which test patterns are determined as well as the corresponding subset used to remove faulty chips 900 (on a semiconductor substrate 910 depicting various circuit paths 920) as depicted in FIG. 9. The fine-grained grid 940 may include relatively smaller subareas 950 relative to other grids and the typical particle 930 (as depicted in FIG. 9). The testing may be continued as a subset of test patterns is run at the finer-grain level. The finer-grained grid may be used after the coarser grained grid. All remaining patterns after the finest-grain subset has passed can be run on the parts that have passed the area-based patterns, to ensure full coverage. In other embodiments, multiple sets of increasing fine-grained grids may be used to identify and order in which tests should be run.

In some embodiments, the area is conceptually divided into the grid of subareas based on a minimum particle contaminant size. The minimum particle contaminant size may be dependent on the semiconductor fabrication process being used and/or the foundry at which the fabrication is performed, in some embodiments. For example, the minimum particle size may be the minimum size encountered at a particular foundry and/or the minimum particle size that is expected to cause damage to the chip. For example, minimum particle sizes on the order of tens of nanometers to hundreds of nanometers in diameter may be used in current advanced semiconductor fabrication processes of 10 nanometer, 7 nanometer, 5 nanometer, etc. For such processes, the physical size of logic gates and/or wiring in the metal layers may be around the above range, and thus a particle of the size in those ranges may impact more than one path. In some embodiments, the area is conceptually divided into a first grid of subareas based on a size greater than a minimum particle contaminant size and identifying a first group of tests, for example a coarser grained grid. The area may be conceptually divided into a second grid of subareas smaller than the subareas of the first grid, as for example the finer grained grid, and identifying a second group of tests. Certainly, there is no limit to the number of conceptual grids which may be applied to the integrated circuit.

Figure 10:
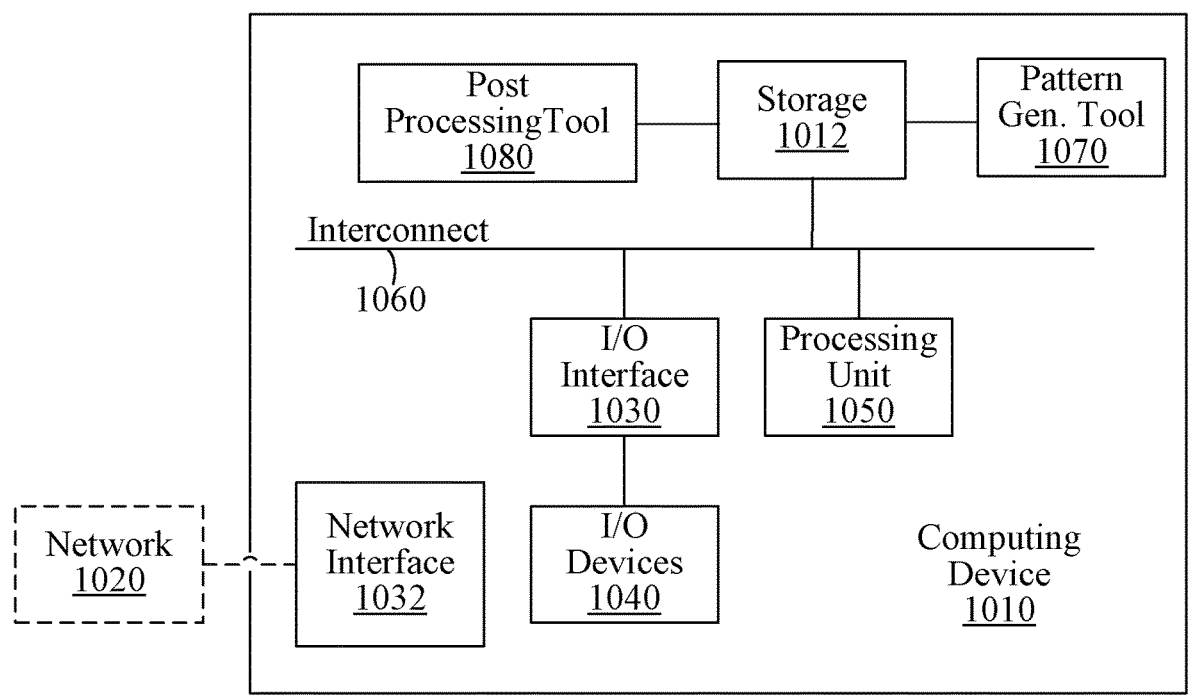
FIG. 10 is a block diagram illustrating an embodiment of a computer system with a computer accessible storage medium that stores code which implements a method described herein and includes test pattern generation tools.

Turning now to FIG. 10, a block diagram of a computing device (which may also be referred to as a computing system) 1010 is depicted, according to some embodiments. Computing device 1010 may be used to implement various portions of this disclosure. Computing device 1010 is one example of a device that may be used as a mobile device, a server computing system, or any other computing system implementing portions of this disclosure.

Computing device 1010 may be any suitable type of device, including, but not limited to, a personal computer system, desktop computer, laptop or notebook computer, mobile phone, mainframe computer system, web server, workstation, or network computer. As shown, computing device 1010 includes processing unit 1050, storage subsystem 1012, input/output (I/O) interface 1030 coupled via interconnect 1060 (e.g., a system bus). I/O interface 1030 may be coupled to one or more I/O devices 1040. Computing device 1010 further includes network interface 1032, which may be coupled to network 1020 for communications with, for example, other computing devices.

The processing unit 1050 may include one or more processors. In some embodiments, processing unit 1050 includes one or more coprocessor units. In some embodiments, multiple instances of processing unit 1050 may be coupled to interconnect 1060. Processing unit 1050 (or each processor within processing unit 1050) may contain a cache or other form of on-board memory. In some embodiments, processing unit 1050 may be implemented as a general-purpose processing unit, and in other embodiments it may be implemented as a special purpose processing unit (e.g., an ASIC). In general, computing device 1010 is not limited to any particular type of processing unit or processor subsystem.

As used herein, the terms "processing unit" or "processing element" refer to circuitry configured to perform operations or to a memory having program instructions stored therein that are executable by one or more processors to perform operations. Accordingly, a processing unit may be implemented as a hardware circuit implemented in a variety of ways. The hardware circuit may include, for example, custom very-large-scale integration (VLSI) circuits or gate arrays, off-the-shelf semiconductors such as logic chips, transistors, or other discrete components. A processing unit may also be implemented in programmable hardware devices such as field programmable gate arrays, programmable array logic, programmable logic devices, or the like. A processing unit may also be configured to execute program instructions or computer instructions from any suitable form of non-transitory computer-readable media to perform specified operations.

Storage subsystem 1012 is usable by processing unit 1050 (e.g., to store instructions executable by and data used by processing unit 1050). Storage subsystem 1012 may be implemented by any suitable type of physical memory media, including hard disk storage, floppy disk storage, removable disk storage, flash memory, random access memory (RAM-SRAM, EDO RAM, SDRAM, DDR SDRAM, RDRAM, etc.), ROM (PROM, EEPROM, etc.), and so on. Storage subsystem 1012 may consist solely of volatile memory in some embodiments. Storage subsystem 1012 may store program instructions executable by computing device 1010 using processing unit 1050, including program instructions executable to cause computing device 1010 to implement the various techniques disclosed herein. Thus, the storage subsystem 1012 may include a computer accessible storage medium storing instructions preforming the method disclosed herein.

In some embodiment, the computing device 1010 may include a pattern generation tool 1070. The pattern generation tool may include executable instruction stored on the storage subsystem 1012. The pattern generation tool may function to generate patterns as disclosed herein. The generated test patterns may exercise circuit paths to test for faults in chips as disclosed herein.

In some embodiment, the computing device 1010 may include a post processing 1080. The post processing tool may include executable instruction stored on the storage subsystem 1012. The post processing tool may function to sort generated patterns sorted based on area coverage to identify a small subset of test patterns that hits all of the grid locations as disclosed herein. The post processing tool may function to further increase the efficiency of the method and systems described herein.

I/O interface 1030 may represent one or more interfaces and may be any of various types of interfaces configured to couple to and communicate with other devices, according to various embodiments. In some embodiments, I/O interface 1030 is a bridge chip from a front-side to one or more back-side buses. I/O interface 1030 may be coupled to one or more I/O devices 1040 via one or more corresponding buses or other interfaces. Examples of I/O devices include storage devices (hard disk, optical drive, removable flash drive, storage array, SAN, or an associated controller), network interface devices, user interface devices or other devices (e.g., graphics, sound, etc.).

In some embodiments, a method may include identifying a first test pattern to test an integrated circuit. The integrated circuit has an area of semiconductor substrate on which it is to be fabricated. The area is conceptually divided into a grid of subareas based on a minimum particle contaminant size. The first test pattern exercises circuit paths within a first subset of the subareas.

In some embodiments, a method may include receiving a plurality of test patterns to be applied to an integrated circuit. The test patterns are arranged in a plurality of groups of test patterns to be applied to the integrated circuit in a specified order. The method may include applying the groups of test patterns in the specified order. The method may include detecting a failure during performance of the tests, stopping and indicating the integrated circuit is defective responsive to the failure. The failure may be the result of a defect. The defect may include extrinsic defects caused by particle contaminants. In some embodiments, the defect in the chip may be fixed or at least circumvented while other times the defect may cause the chip to be discarded.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments.

Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A method, comprising:
    identifying a first test pattern to test an integrated circuit, wherein the integrated circuit has an area of semiconductor substrate on which it is to be fabricated, wherein the area is conceptually divided into a grid of subareas based on a minimum particle contaminant size, and wherein the first test pattern exercises circuit paths within a first subset of the subareas;
    identifying a second test pattern that exercises circuit paths within a second subset of the subareas;
    determining that at least one of subareas in the second subset is excluded from the first subset; and
    including the second test pattern in a first group of tests to be applied to the integrated circuit prior to other test patterns responsive to determining that at least one of the subareas in the second subset is excluded from the first subset, wherein the first group of tests are sufficient to identify extrinsic defects due to particle contamination, and wherein the other test patterns detect intrinsic defects due to process variation.

2. The method of claim 1, further comprising:
    identifying a third test pattern that exercises circuit paths within a third subset of the subareas;
    determining that at least one of subareas in the third subset is excluded from the first subset and the second subset; and
    including the third test pattern in a first group of tests to be applied to the integrated circuit prior to other test patterns responsive to determining that at least one of the subareas in the third subset is excluded from the first subset and the second subset.

3. The method of claim 1, further comprising generating the other test patterns that exercise at least a predetermined percentage of circuit paths in the integrated circuit.

4. The method of claim 1, wherein identifying the first test pattern to test the integrated circuit further comprises identifying the first test pattern which exercises circuit paths through a greatest number of subareas relative to other test patterns.

5. The method of claim 1, wherein identifying the second test pattern further comprises identifying the second test pattern which exercises circuit paths through a greatest number of subareas excluded from the first test pattern.

6. The method of claim 1, wherein the area is conceptually divided into a first grid of subareas based on a size greater than a minimum particle contaminant size and identifying a first group of tests, and wherein the area is conceptually divided into a second grid of subareas smaller than the subareas of the first grid and identifying a second group of tests.

7. The method of claim 1, further comprising applying the first group of tests to an instance of the integrated circuit to identify defects in the integrated circuit.

8. The method of claim 1, further comprising annotating an integrated circuit definition file with location data to identify which subareas a given circuit path passes through.

9. The method of claim 1, wherein the test patterns in the first group of tests contact all portions of the grid.

10. A method, comprising:
    receiving a plurality of test patterns to be applied to an integrated circuit, wherein the test patterns are arranged in a plurality of groups of test patterns to be applied to the integrated circuit in a specified order, wherein an initial group of the plurality of groups of test patterns, when applied, exercises at least one circuit path in each grid location in a grid of subareas of the integrated circuit, wherein a size of the subareas is based on a minimum particle contaminant size, and the initial group is sufficient to identify extrinsic defects due to particle contamination, and wherein remaining groups of the plurality of groups of test patterns, when applied, exercise other circuit paths within the integrated circuit to detect intrinsic defects based on process variations;
    applying the groups of test patterns in the specified order; and
    during the applying:
    detecting a failure during performance of the test patterns;
    stopping the applying based on detecting the failure; and
    indicating the integrated circuit is defective responsive to the failure.

11. A method, comprising:
    identifying a first test pattern to test an integrated circuit, wherein the integrated circuit has an area of semiconductor substrate on which it is to be fabricated, wherein the area is conceptually divided into a grid of subareas based on a minimum particle contaminant size, and wherein the first test pattern exercises circuit paths within a first subset of the subareas, and wherein applying the first test pattern to the integrated circuit is sufficient to identify extrinsic defects due to particle contamination within the first subset of subareas; and
    identifying one or more additional test patterns that exercises remaining circuit paths within the first subset of subareas to detect intrinsic defects due to process variation.

12. The method of claim 11, further comprising:
    identifying a second test pattern that exercises circuit paths within a second subset of the subareas;
    determining that at least one of subareas in the second subset is excluded from the first subset; and
    including the second test pattern in a first group of tests to be applied to the integrated circuit prior to other test patterns responsive to determining that at least one of the subareas in the second subset is excluded from the first sub set.

13. The method of claim 12, wherein the test patterns in the first group of tests contact all portions of the grid.

14. The method of claim 12, further comprising:
    identifying a third test pattern that exercises circuit paths within a third subset of the subareas;
    determining that at least one of subareas in the third subset is excluded from the first subset and the second subset; and
    including the third test pattern in a first group of tests to be applied to the integrated circuit prior to other test patterns responsive to determining that at least one of the subareas in the third subset is excluded from the first subset and the second subset.

15. The method of claim 12, further comprising applying the first group of tests to an instance of the integrated circuit to identify extrinsic defects in the integrated circuit.

16. The method of claim 11, further comprising annotating an integrated circuit definition file with location data to identify which subareas a given circuit path passes through.

\* \* \* \* \*

UNITED STATES PATENT AND TRADEMARK OFFICE
CERTIFICATE OF CORRECTION

| | |
|---|---|
| PATENT NO. | : 11,500,019 B2 |
| APPLICATION NO. | : 16/874075 |
| DATED | : November 15, 2022 |
| INVENTOR(S) | : Edgardo F. Klass et al. |

It is certified that error appears in the above-identified patent and that said Letters Patent is hereby corrected as shown below:

In the Claims

Column 12, Line 51, Claim 12, delete "sub set" and insert --subset--.

Signed and Sealed this
Thirtieth Day of May, 2023

Katherine Kelly Vidal
*Director of the United States Patent and Trademark Office*